(12) United States Patent
Pedersen

(10) Patent No.: US 6,873,181 B1
(45) Date of Patent: Mar. 29, 2005

(54) AUTOMATED IMPLEMENTATION OF NON-ARITHMETIC OPERATORS IN AN ARITHMETIC LOGIC CELL

(75) Inventor: Bruce Pedersen, San Jose, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 10/640,712

(22) Filed: Aug. 13, 2003

(51) Int. Cl.[7] .......................... H03K 19/173; G06F 7/38
(52) U.S. Cl. ........................ 326/38; 708/232; 716/1
(58) Field of Search .......................... 326/37–39, 41, 326/47; 708/230, 232; 716/1

(56) References Cited

U.S. PATENT DOCUMENTS

| | | | | |
|---|---|---|---|---|
| 5,485,411 A | * | 1/1996 | Guttag et al. | 708/230 |
| 5,898,602 A | * | 4/1999 | Rothman et al. | 708/230 |
| 6,480,023 B1 | * | 11/2002 | Kaviani | 326/38 |

OTHER PUBLICATIONS

Elzinga, S. et al. (Jun. 28, 2000). "Design Tips for HDL Implementation of Arithmetic Functions," *EXILINK® Application Note: Virtex Series*, XAPP215 (v1.0), pp. 1–13.
EXILINK® (Feb. 28, 2000). "Virtex–E 1.8V Field Programmable Gate Arrays," *The Programmable Logic Data Book 2000* Xilinx, Inc. DS022(v1.3) Advance Product Specification, six pages.

* cited by examiner

*Primary Examiner*—James H. Cho
(74) *Attorney, Agent, or Firm*—Morrison & Foerster LLP

(57) ABSTRACT

Disclosed is a method of freeing up a non-arithmetic logic block by configuring an LE driving the non-arithmetic logic block to carry out the non-arithmetic logic function of the non-arithmetic logic block. Appropriately configured LEs are identified and the LEs are reconfigured to incorporate or "push back" the non-arithmetic logic into the LE, thus advantageously freeing up the non-arithmetic logic block and allowing it to be used for logic functions driven by other LEs.

14 Claims, 5 Drawing Sheets

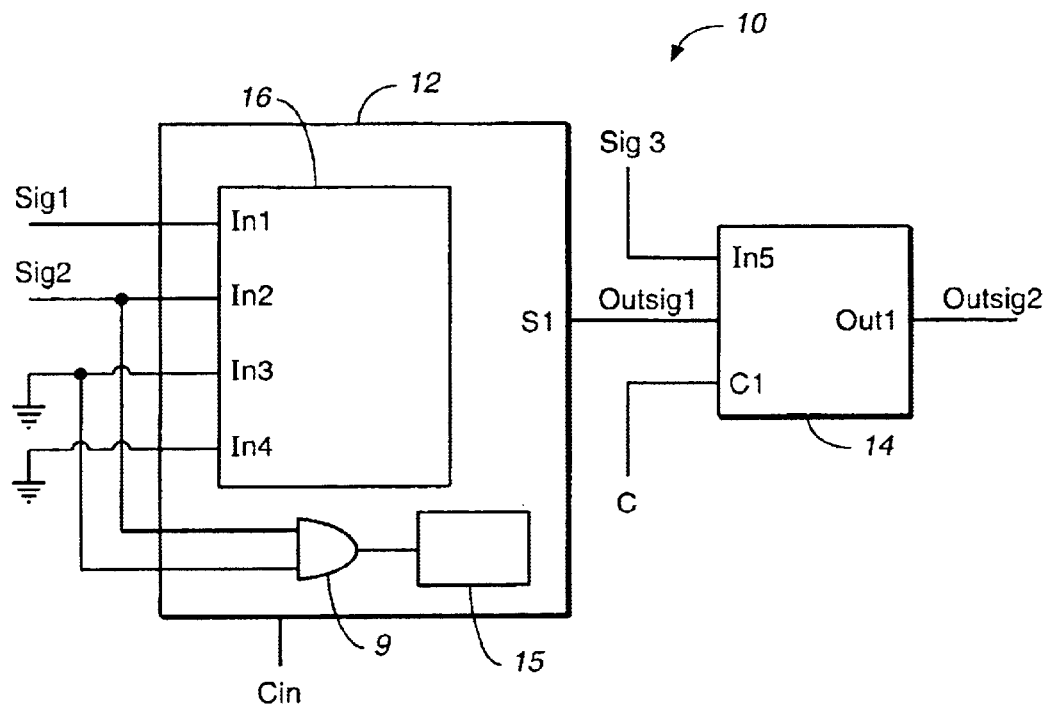
FIG._1
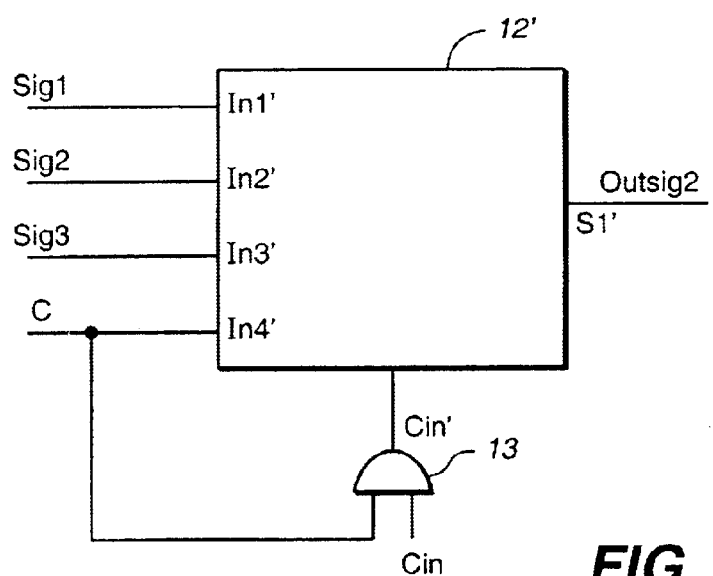
FIG._2

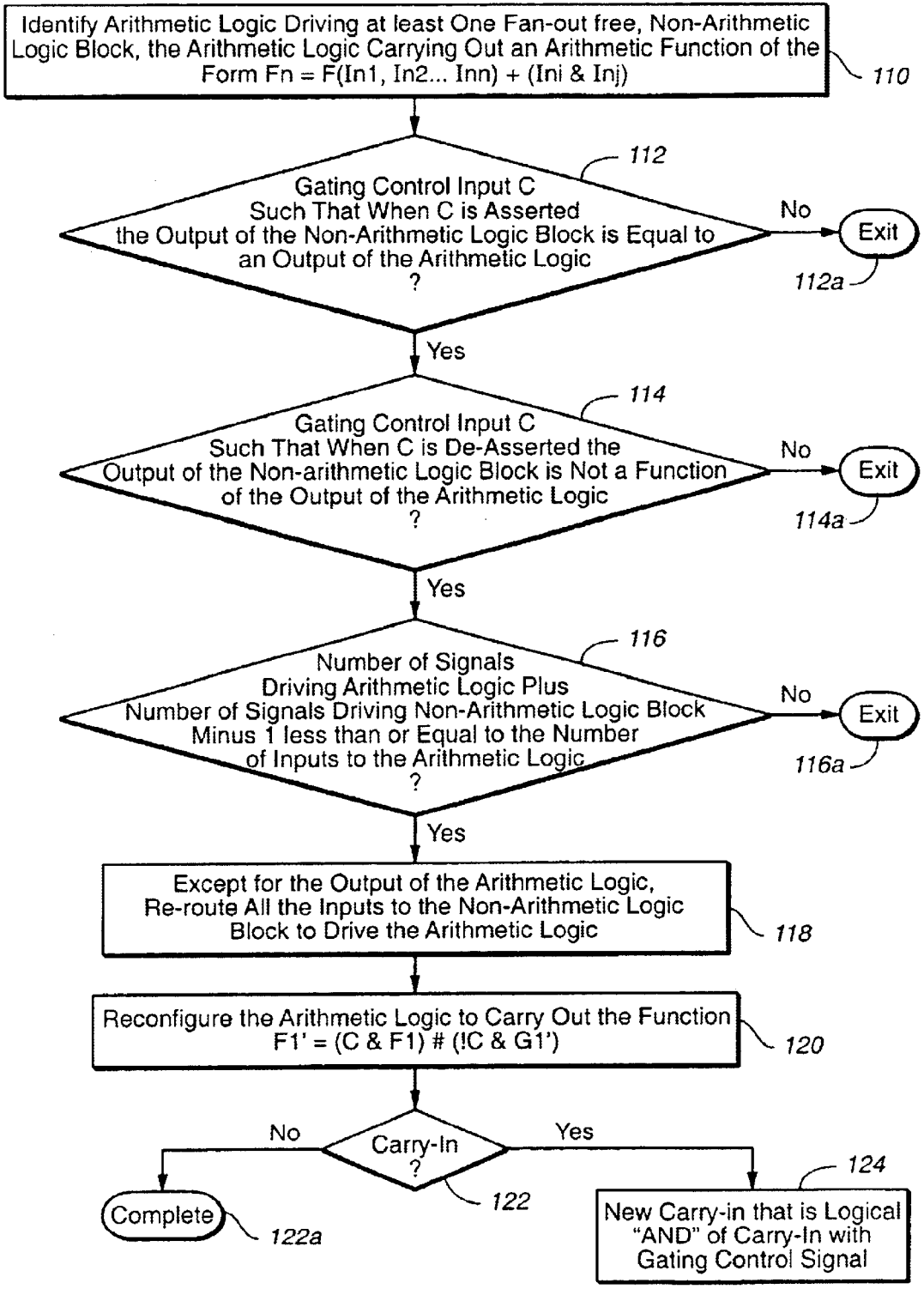
FIG._3

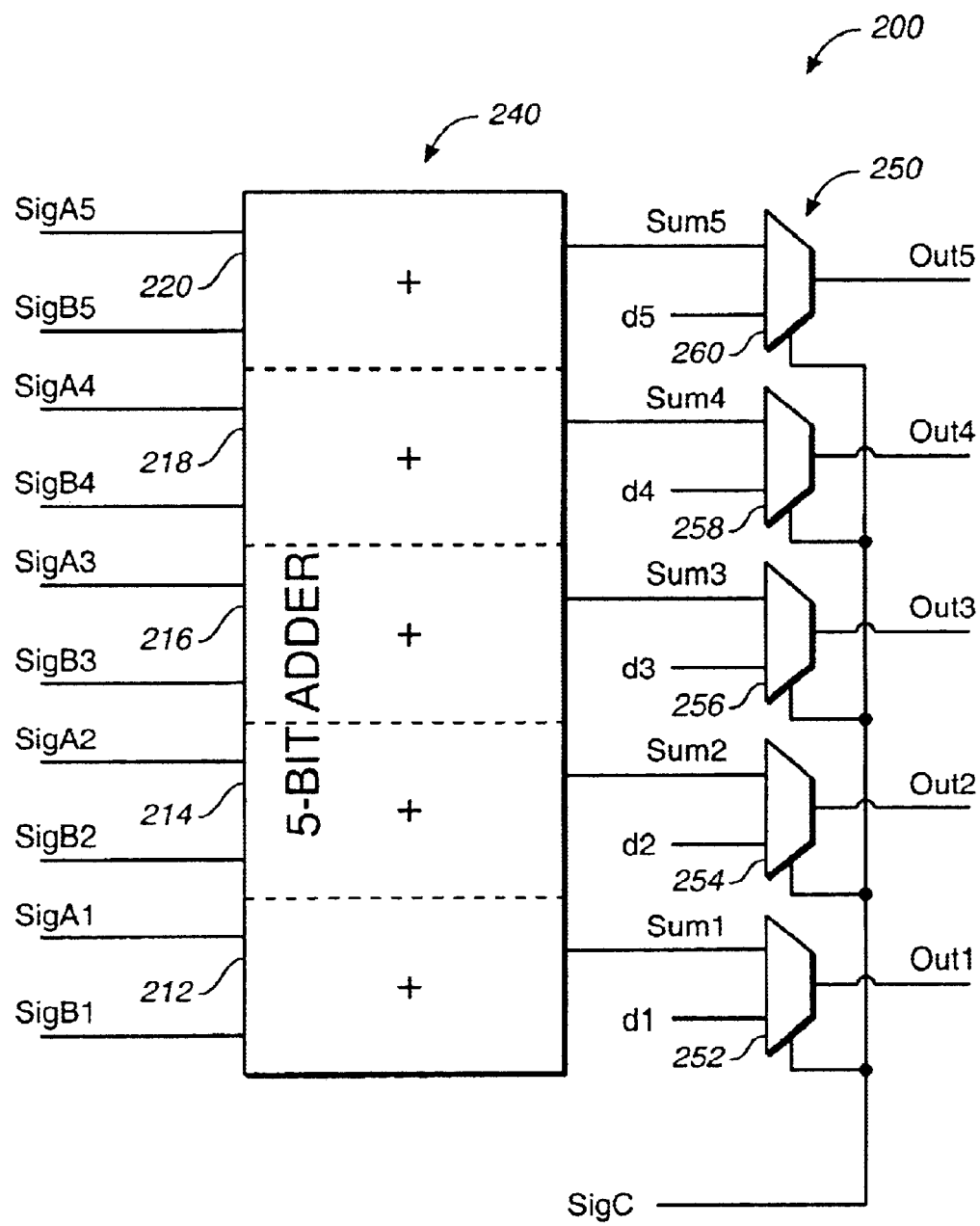
FIG._4

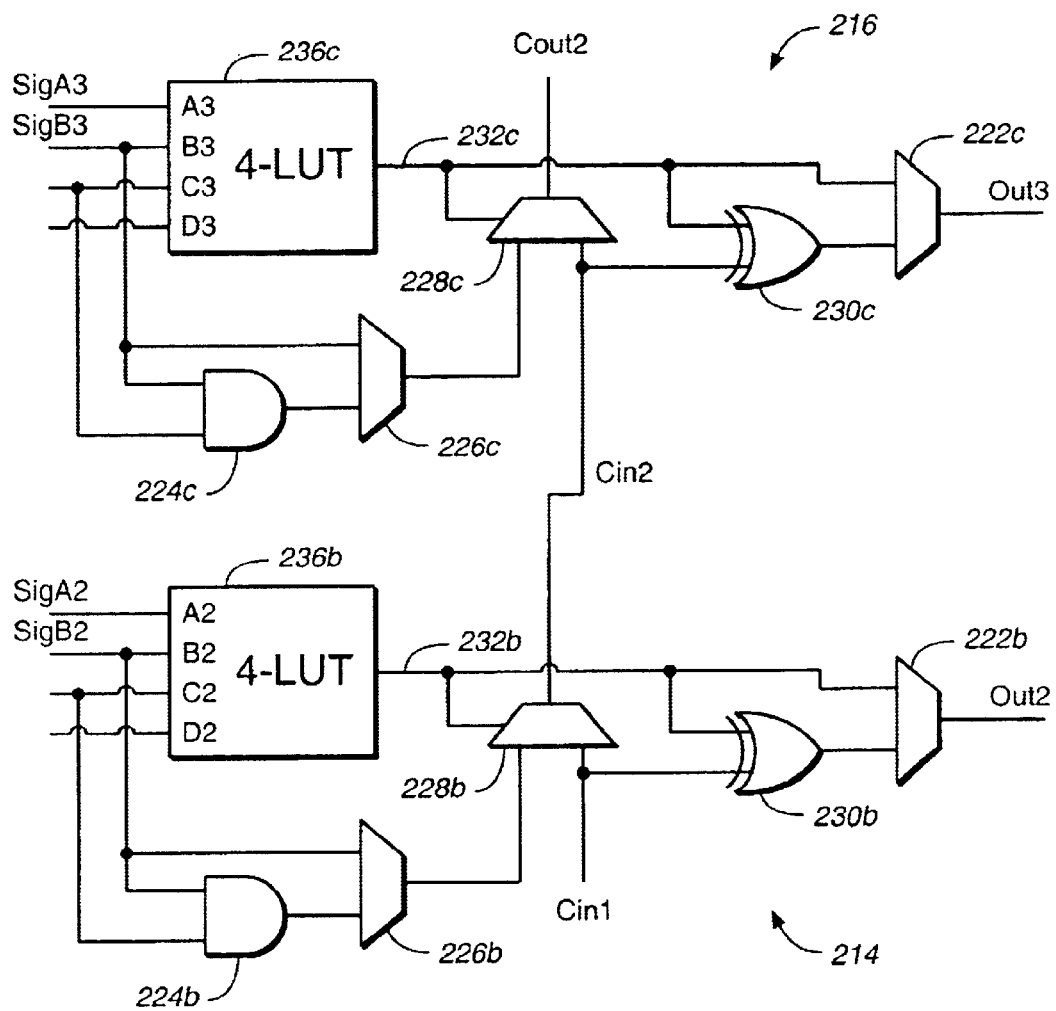
FIG._5

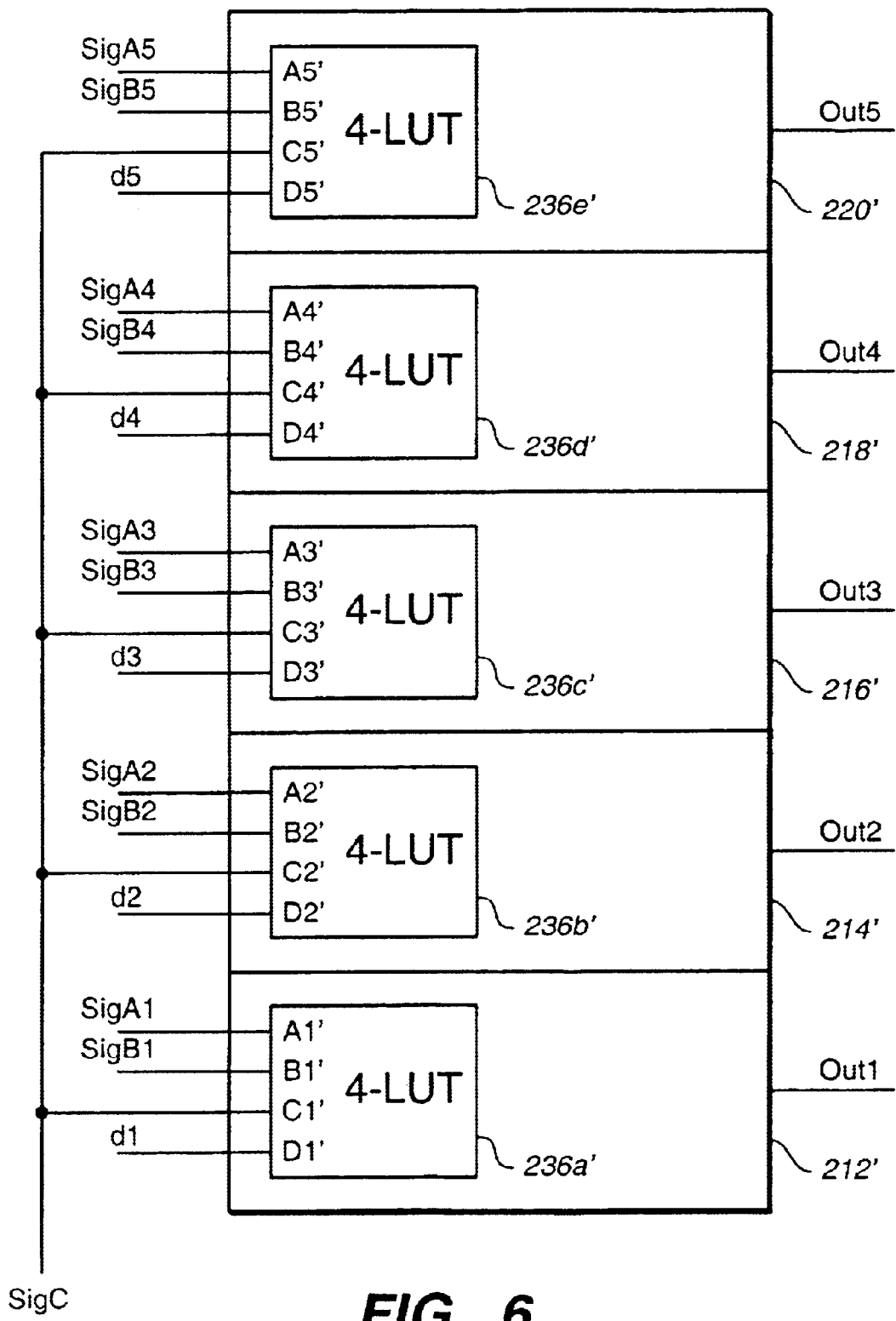
FIG._6

AUTOMATED IMPLEMENTATION OF NON-ARITHMETIC OPERATORS IN AN ARITHMETIC LOGIC CELL

BACKGROUND OF THE INVENTION

Programmable logic devices ("PLDs") (also sometimes referred to as CPLDs, PALs, PLAs, FPLAs, EPLDs, EEPLDs, LCAs, FPGAs, or by other names), are well-known integrated circuits that provide the advantages of fixed integrated circuits with the flexibility of custom integrated circuits. Such devices typically provide an "off the shelf" device having at least a portion that can be electrically programmed to meet a user's specific needs. Application specific integrated circuits ("ASICs") have traditionally been fixed integrated circuits, however, it is possible to provide an ASIC that has a portion or portions that are programmable; thus, it is possible for an integrated circuit device to have qualities of both an ASIC and a PLD. The term PLD as used herein will be considered broad enough to include such devices.

PLDs may include blocks of logic elements ("LE"s), sometimes referred to as logic array blocks ("LABs"; also referred to by other names, e.g., "configurable logic blocks," or "CLBs"). LEs typically include components that carry out arithmetic logic functions and other components that carry out non-arithmetic logic functions. As used herein, arithmetic logic functions indicates functions including, without limitation, addition, subtraction, multiplication, division and comparison. Non-arithmetic logic functions include, without limitation, Boolean logic functions such as AND, OR, XOR, NOR and NOT.

Often, the arithmetic logic functions in a logic cell are carried out by a look up table (LUT), but can also be carried out by other elements such as product terms, carry-out chains, registers, and other elements. The LUT is typically followed by one or more logic gates and/or multiplexers.

To carry out a desired logic operation, it is often the case that an LE will be configured in an arithmetic logic mode to carry out an arithmetic logic function. An output form the LE will then drive a block of non-arithmetic logic to complete the logic operation. Often, the logic operation will require more non-arithmetic logic gates than those available to the single LE. In such a case, the non-arithmetic logic blocks available to other LEs can typically be used. However, this can be inefficient if the arithmetic logic operator of the other LEs are not usable by themselves (that is, without needing to use the non-arithmetic logic block available to the same LE) to carry out necessary arithmetic logic. In such a case, just the non-arithmetic logic blocks available to one or more LEs might be used, thus taking up more space in a PLD than is desirable.

BRIEF SUMMARY OF THE INVENTION

The present invention includes a method of freeing up blocks of logic that implement non-arithmetic functions. Specifically, in a method in accordance with the present invention, an appropriately configured LE which carries out an arithmetic logic function and which feeds non-arithmetic logic is identified. The LE is then reconfigured to incorporate or "push back" the non-arithmetic logic into the LE, advantageously freeing up the non-arithmetic logic and allowing it to be used for logic functions driven by other LEs.

In a method of the present invention an arithmetic, programmable logic element (LE) performing an arithmetic logic function Fn is identified. The programmable LE includes a plurality of inputs, at least 2 of which drive the inputs of a logical AND gate. The programmable LE also includes and at least one output Sn driving a fan-out free, non-arithmetic logic block. The non-arithmetic logic block can have a plurality of inputs including an input c and at least one further input such that when c is asserted, an output Gn of the non-arithmetic logic block is equal to output Sn of the programmable LE and when c is not asserted, the output Gn of the non-arithmetic logic block is not a function of output Sn. Additionally, it is determined whether the number of signals driving the programmable logic operator plus the number of signals driving the non-arithmetic logic block minus I is less than or equal to the number of inputs to the programmable logic operator. If these conditions are met, then the further input and the input c to the non-arithmetic logic block are re-reouted to drive the programmable LE. Also, the function Fn of the arithmetic programmable logic operator is reprogrammed to carry out the function Fn' such that when c is asserted Fn' is equal to Fn and when c is not asserted Fn' is equal to Gn with Sn de-asserted.

BRIEF DESCRIPTION OF THE DRAWINGS

FIG. 1 is a block diagram of a logic cell having an arithmetic logic operator and non-arithmetic logic block in which a method of freeing non-arithmetic logic in accordance with the present invention may be implemented.

FIG. 2 is a block diagram of a logic cell having an arithmetic logic section illustrating implementation of a method of freeing non-arithmetic logic in accordance with the present invention.

FIG. 3 is a flow chart illustrating a method of freeing non-arithmetic logic in a logic element in accordance with the present invention.

FIG. 4 is a block diagram illustrating a logic cell including a 5-bit adder followed by two input multiplexers in which a method in accordance with the present invention may be implemented.

FIG. 5 is a schematic diagram showing details of the logic cells of the 5-bit adder shown in FIG. 4.

FIG. 6 is a block diagram illustrating the 5 bit adder shown in FIG. 4 after implementation of a method of freeing non-arithmetic logic in accordance with the present invention.

DETAILED DESCRIPTION OF THE INVENTION

The present invention includes a method of freeing up blocks of logic that implement non-arithmetic functions. Specifically, in a method in accordance with the present invention, appropriately configured LEs which use arithmetic logic and which feed blocks of non-arithmetic logic are identified and the LEs are reconfigured to "push back" the non-arithmetic logic into the LE, thus freeing up the non-arithmetic logic block.

FIG. 1 is a block diagram of a logic circuit 10 in which the present invention may be implemented. Logic circuit 10 includes an LE 12 in arithmetic mode and a non-arithmetic logic block 14. As shown in FIG. 1, LE 12 includes four inputs In1, In2, In3 and In4, and one output, S1. LE 12 may also optionally include a carry-in input Cin. LE 12 also includes at least one look up table (LUT) 16. In the embodiment shown, LUT 16 is driven by inputs In1, In2, In3 and In4. LE 12 also includes at least AND gate 9 having a first input tied to In2 of LUT 16 and a second input tied to In3 of LUT 16. LE 12 may also, but need not, include additional logic 15. Additional logic 15 can include, without limitation, additional logic gates such as AND, OR, NAND, NOT and NOR gates and one or more multiplexers. Any or all of inputs In1, In2, In3 and In4 may also drive other logic included in LE 12. LE 12 may also include additional inputs that do not drive 4-LUT 16 (such as, for example, carry-in input Cin). Further, LUT 16 can include greater or fewer than 4 inputs. Inputs In1 and In2 are driven by signals Sig1 and Sig2, respectively. The output signal on output S1 is designated Outsig1. In the example of FIG. 1, inputs In3 and In4 are left open. Inputs left open are typically tied to either Vcc (supply voltage) or ground. Output S1 of arithmetic logic cell 12 drives non-arithmetic logic block 14 which includes 2 additional inputs In5 and control input C1. A signal Sig3 drives input In5 and a control signal C drives input C1. Non-arithmetic logic block 14 drives output Out1 with output signal Outsig2.

Arithmetic logic cell 12 is programmed with an arithmetic function F1 which has the form F(In1, In2, In3, In4)+(In2 & In3), where & indicates a logical AND function. The final term, (In2 & In3), is facilitated by AND gate 9, which may be driven by any two input to LUT 16. F(In1, In2, In3, In4) can be any arithmetic logic function or combination of such functions and can include greater or fewer than 4 variables. Non-arithmetic logic block 14 carries out a non-arithmetic function G1 which can be any non-arithmetic function or combination of non-arithmetic functions including, without limitation, AND, OR, NOT and NOR or a multiplexing of two input signals. Non-arithmetic logic block 14 preferably includes one or more logic gates (not shown) configured to implement non-arithmetic function G1. Additionally, though in the general example shown in FIG. 1 LE 12 includes only output S1 driving non-arithmetic logic block 14, it is considered that LE 12 include more that one output each driving an additional, non-arithmetic logic block.

In order to implement the method of the present invention, non-arithmetic logic block 14 must be a "fanout free" block of logic. That is, all the logic gates in logic block 14, except for the logic gate that drives Out1, must drive only other logic gates in logic block 14. Additionally, signal C carried on control input C1 is an active-high gating control signal for the signal on S1. In particular, when C is asserted the output of G1, Outsig2, is equal to output of F1, Outsig1, and when C is de-asserted Outsig2 is not a function of Outsig1, but is still some function of Sig3. Further, in order to implement the method of the present invention, the number of unique signals driving LE 12 plus the number of signal driving the non-arithmetic logic block 14 other than the input from LE 12, must be less than or equal to the number of inputs to LE 12. Specifically, in FIG. 1, LE 12 is driven by 2 unique signals, Sig1 and Sig2, and non-arithmetic logic block 14 is driven by 2 signals, Sig3 and C, other than the output of LE 12. This is a total of 4 signals and LE 12 includes 4 inputs In1, In2, In3 and In4.

In accordance with a method of the present invention, logic circuit 10 is reconfigured to free for use non-arithmetic logic block 14 while still generating Outsig2 from signals on inputs In1, In2, In3 and In4. That is, the reconfigured logic circuit carries out the same logic function as logic circuit 10 while eliminating the need for non-arithmetic logic block 14.

FIG. 2 is a block diagram of a logic circuit 10' including LE 12' which is identical to LE 12 shown in FIG. 1 except that it has been reconfigured as discussed below. LE 12' includes inputs In1', In2', In3' and In4' and output S1'. In a method of pushing non-arithmetic logic back onto an LE in arithmetic mode in accordance with the present invention, LE 12' is configured with a function F1' given by:

$$F1'=(C \& F1)\# (!C \& G1')$$

where "&" signifies a logical AND operation, "#" signifies a logical OR operation and "!" signifies a logical NOT and G1' is equal to G1 with S1 forced to zero (this is because, as discussed above, when C is de-asserted, G1 is not a function of S1). That is, logic cell 12' is configured such that F1' is equal to F1 when C is asserted and equal to G1' when C is de-asserted. Also, as shown in FIG. 1, LE 12 may include a carry-in Cin. If this is the case, then in reconfigured logic circuit 10', the carry-in signal must be logically ANDed with the gating control signal. Specifically, as shown in FIG. 2, AND gate 13 is used to logically AND carry-in Cin with gating control signal C to generate signal Cin', which then drives the carry-in input of LE 12'. That is:

$$Cin'=Cin \& C.$$

Additionally, as with LE 12, Sig1 and Sig2 drive inputs In1' and In2' of LE 12'. Because logic block 14 is eliminated in logic circuit 10', Sig3 and C can no longer drive inputs In5 and C1 of logic block 14. However, LE 12' has been configured with F1' which, because F1' is a function of G1, uses as inputs Sig3 and C. Thus, in logic circuit 10' Sig3 and C drive inputs In3' and In4', respectively, of LE 12' and S1' now generates output signal Outsig2. In this way, logic circuit 10 has been reconfigured to carry out the same logic function while eliminating the need for non-arithmetic logic block 14. Thus, if LE 10 were contained in a PLD, non-arithmetic logic block 14 could advantageously be used to carry out other logic functions.

FIG. 3 is a flow diagram illustrating the steps of the method 100 of pushing a non-arithmetic logic function back into an LE in arithmetic mode. Method 100 will be described in the context of logic circuit 10 of FIG. 1 and logic circuit 10' of FIG. 2. Method 100, however, is not limited to being carried out in this embodiment. In step 100, LE 12 driving at least one non-arithmetic logic block 14 is identified. LE 12 is preferably, but not necessarily, part of a PLD such that implementation of the method of the present invention will allow a plurality of non-arithmetic logic blocks, such as arithmetic logic block 14, to be freed for configuration of additional logic.

In step 110, a logic cell is identified that includes at least one arithmetic operator, such as arithmetic logic cell 12, driving at least one fan-out free, non-arithmetic logic block, such as logic block 14, and carrying out a logic function Fn of the general form:

$$F1=F(In1, In2 \ldots Inn)+(Ini \& Inj)$$

where In1, In2 . . . Inn are plurality of n inputs to the programmable logic element, Ini and Inj are two of the plurality of n inputs to the programmable logic element, and & indicates a logical AND function.

In step 112, it is determined whether a non-arithmetic logic block 14 is driven by a gating control input C such that when gating control input C is high, output Outsig2 of non-arithmetic logic block 14 is equal to output Outsig1 of LE 12. If it is not, then, in step 112*a*, method 100 exits. If the condition of step 112 is met, then in step 114 it is determined whether when gating control input C is de-asserted, the output Outsig2 of non-arithmetic logic block 14 is not a function of output Outsig1 of arithmetic LE 12. If this condition is not met, then in step 114*a* method 100 exits. If the condition of step 114 is found, then method 100 moves on to step 116 in which it is determined whether the number of signals driving LE 12 plus the the number of signals driving non-arithmetic logic block 14 minus one (input S1 from arithmetic LE 12) is less than or equal to the number of inputs to LE 12. If this condition is not met, then in step 116a, method 100 exits. If the condition of step 116 is met, then logic circuit 10 can be reconfigured to eliminate non-arithmetic logic block 14.

To free-up non-arithmetic logic block 14, in step 118, all of the inputs to non-arithmetic logic block 14 except for output S1 from arithmetic LE 12, are re-routed to drive LE 12. Then, in step 120, LE 12 is reconfigured such that when the gating control signal C is asserted, the output of LE 12 is the original output, e.g., the output Outsig1 of logic function F1, and when the gating control signal is de-asserted, the output is the output Outsig2 of the function carried out by non-arithmetic logic block 14 with the output of arithmetic logic cell 12 forced to zero, e.g. G1'. That is, arithmetic logic operator 12 is reconfigured with the function F1' given by:

F1'=(C & F1)# (!C & G1').

In this way, non-arithmetic logic cell 14 may be eliminated from logic circuit 10, and thereby advantageously used for other logic, while the function of logic circuit 10 is retained.

If arithmetic logic operator 12 uses a carry-in signal Cin, such as for providing a carry bit from an addition function of an adjacent logic operator, method 100 determines this in step 122. If arithmetic logic cell 12 does not use carry-in signal Cin, then in step 122a, method 100 completes. If, however, arithmetic logic cell 12 uses carry-in signal Cin, then method 100 moves to step 124. In step 124, the original carry-in signal Cin (that is, the carry-in signal prior to reconfiguring the logic circuit) is logically ANDed with the gating control signal C such that when Cin is asserted the carry-in Cin' to reconfigured logic cell 12' shown in FIG. 2 is given by Cin and when gating control signal C1 is de-asserted, Cin' is de-asserted.

Method 100 is preferably carried out by a computer using computer code programmed to carry out the algorithm of method 100 and can be stored on a computer readable medium such as a floppy disk or compact disk as is well understood by those skilled in the art. Such code can be included, for example, in a software PLD configuration tool. One such configuration tool is marketed under the name Quartus® by Altera Corporation of San Jose, Calif.

FIG. 4 is a schematic diagram of a logic circuit 200 which can be used to illustrate one embodiment of a method of pushing non-arithmetic logic back into an arithmetic logic operator in accordance with the present invention. Logic circuit 200 is preferably included in a programmable logic device (not shown). Logic circuit 200 includes a logic operator 240 configured in an arithmetic mode and a non-arithmetic logic section 250. Logic operator 240 includes five LEs 212, 214, 216, 218 and 220 which together form a 5 bit adder. Each LE is driven by two input signals and generates a single output signal; LE 212 is driven by input signals SigA1 and SigB1 and output signal Sum1, LE 214 has input signals SigA2 and SigB2 and output signal Sum2, LE 216 has inputs signals SigA3 and SigB3 and output signal Sum3, LE 218 has input signals SigA4 and SigB4 and output signal Sum4, and LE 220 has input signals SigA5 and SigB5 and output signal Sum5. Non-arithmetic logic section 250 includes five, two input multiplexers (2-MLTXs) 252, 254, 256, 258 and 260. Each 2-MUX has 2 signal inputs, a control input and one output. 2-MUX 252 has input signals Sum1 and d1 and output signal Out1; 2-MUX 254 has input signals Sum2 and d2 and output signal Out2; 2-MUX 256 has input signals Sum3 and d3 and output signal Out3; 2-MUX 258 has input signals Sum4 and d4 and output Out4, and 2-MUX 260 has input signals Sum5 and d5 and output Out5. Each 2-MUX 252, 254, 256, 258 and 260 is driven by a common control input signal SigC.

Output signal Out1 of 2-MUX 252 of logic circuit 200 is given by the following equation:

Out1=Sum1 & SigC# d1 & !SigC

Where "&" signifies a logical AND operation, "#" signifies a logical OR operation and"!" signifies a logical NOT. As reflected by the above equation, depending on the state of control input signal SigC, Out1 of 2-MUX 252 is either Sum1 or d1. Specifically, if SigC is asserted, Out1 is equal to Sum1 and if C is de-asserted Out1 is equal to d1. Output signals Out2, Out3, Out4 and Out5 of 2-MUXs 254, 256, 258 and 260, respectively are similarly given by, respectively:

Out2=Sum2 & SigC# d2 & !SigC

Out3=Sum3 & SigC# d3 & !SigC

Out4=Sum4 & SigC# d4 & !SigC

Out5=Sum5 & SigC# d5 & !SigC

Although arithmetic logic operator 240 of logic circuit 200 is a 5-bit adder, as discussed above, the arithmetic logic section of a logic circuit in which the method of the present invention may be implemented can also be a subtraction function. Additionally, also as discussed above, though non-arithmetic logic section 250 includes 2-MUXs, the non-arithmetic logic section of a logic circuit in which the method of the present invention may be implemented can include any non-arithmetic logic function or combination of non-arithmetic logic functions such as, without limitation, AND, OR, XOR, and NOT.

FIG. 5 is a schematic drawing of one embodiment of the details of LEs 214 and 216 that can be included in the logic circuit 200 shown in FIG. 4. LE 214 includes 4 inputs A2, B2, C2, and D2 which feed a first four input look up table (4-LUT) 236b. LE 216 also includes 4 inputs A3, B3, C3 and D3, which feed a second 4-LUT 236c. LE 214 includes output signal Out2 and logic cell 216 includes output signal Out3. Additionally LE 214 includes a carry input Cin1 and logic cell 216 includes carry input Cin2 and carry output Cout2. 4-LUT 236b and 4-LUT 236c each have single outputs 232b and 232c, respectively, which each drive a first input of an output multiplexer 222b and 222c, respectively. Multiplexers 222b and 222c are each 2 input multiplexers (2-MUXs). LEs 214 and 215 also include AND gates 224b and 224c, respectively. AND gate 224b is driven by inputs B2 and C2 of 4-LUT 236b. Similarly, AND gate 224c is driven by inputs B3 and C3 of 4-LUT 236c. The output of AND gate 224b feeds one input of a 2-MUX 226b and the output of AND gate 224c feeds one input of a 2-MUX 226c. The second inputs of 2-MUXs 226b and 226c are driven by inputs C2 and C3, respectively. The output of 2-MUXs 226b and 226c in turn feeds one input of carry-in 2-MUXs 228b and 228c, respectively. LEs 214 and 216 each also include exclusive OR (XOR) gates 230b and 230c, respectively. A first input of each XOR gate 230b, 230c is fed by outputs 232b, 232c, respectively, of 4-LUTs 236b and 236c, respectively. Second inputs of XOR gates 230b and 230c are fed by carry inputs Cin1 and Cin2, respectively which also feed a second input of carry-in 2-MUXs 228b, 228c, respectively.

The control bit of carry-in 2-MUX 228a is driven by output 232b of 4-LUT 236b and the control bit of carry-in 2-MUX 228c is driven by output 232c of 4-LUT 236c.

As utilized in logic circuit 200, only inputs A2 and B2 of LE 214 are used and only inputs A3 and B3 of LE 216 are used. Inputs C2, C3, D2 and D3 can be tied to ground or Vcc. Inputs A2 and B3 are driven by signals SigA2 and SigB2, respectively and inputs A3 and B3 are driven by signals SigA3 and SigB3, respectively. Additionally, carry input Cin1 of LE 214 is preferably connected to a carry output (not shown) of LE 212 and carry output Cout2 of logic cell 216 is connected to a carry input (not shown) of LE 218.

In a method in accordance with the present invention, the non-arithmetic logic included in non-arithmetic logic section 250 of logic circuit 200 is pushed back or incorporated into the LEs 212, 214, 216, 218 and 220 of logic operator 240. As discussed above, non-arithmetic logic section 250 includes a gating control input signal SigC such that when SigC is asserted, the output signals Out1, Out2, Out3, Out4 and Out5 of 2-MUXs 252, 254, 256, 258 and 260, respectively, are equal to the output signals Sum1, Sum2, Sum3, Sum4 and Sum5, respectively, of the associated LEs 212, 214, 216, 218 and 220, respectively. Further, when SigC is de-asserted, the output of 2-MUXs 252, 254, 256, 258 and 260 are not a function of the output signals Sum1, Sum2, Sum3, Sum4 and Sum5, respectively, of the associated LEs 212, 214, 216, 218 and 220, respectively. Rather, when C is de-asserted, the output of 2-MUXs 252, 254, 256,258 and 260 are signals d1, d2, d3, d4 and d5, respectively.

Finally, as noted above, 2-MUXs 252, 254, 256, 258 and 260 each include three inputs. And, as discussed above, each LE 212, 214, 216, 218 and 220 includes a LUT, such as 4-LUT 236a and 236b of LEs 214 and 216, respectively, shown in FIG. 5, having 4 inputs each. Also, each LUT is driven by only 2 independent signals. For example, LUT 236b is driven by SigA2 and SigB2. Thus, the number of signals driving to 2-MUXs 252, 254, 256, 258 and 260 plus the number of signal driving LEs 212, 214,216, 218 and 220 minus 1 is 4, and this is equal to the 4 inputs of each LE 212, 214, 216, 218 and 220. Thus, the function of non-arithmetic logic blocks 250 of logic circuit 200 can be incorporated into the arithmetic logic operator 240 in accordance with present invention.

To accomplish this, all input signals d1, d2, d3, d4, d5 and SigC to 2-MUXs 252, 254, 256, 258 and 260, respectively, except for signals Sum1, Sum2, Sum3, Sum4 and Sum5 from arithmetic logic operator 240, are re-routed to drive arithmetic logic operator 240. FIG. 6 is a schematic diagram showing a logic circuit 200' illustrating the re-routing of logic circuit 200 in accordance with the present invention. Logic circuit 200' includes arithmetic logic operator 240', which is physically equivalent to arithmetic logic operator 240 but configured differently as discussed below. Arithmetic logic operator 240' includes LEs 212', 214', 216', 218' and 220' which include 4-LUTs 236a', 236b' 236c' 236d' and 236e', respectively. The physical details of each LE 212', 214, 216', 218' and 220' are as shown in LEs 214 and 216 of FIG. 5. Though the other components shown in FIG. 5 are included in LEs 212', 214', 216', 218' and 220', FIG. 6 only shows 4-LUTs 236a', 236b', 236c', 236d' and 236e'. 4-LUT 236a' includes inputs A1', B1', C1' and D1', 4-LUT 236b' includes inputs A2', B2', C2' and D2', 4-LUT 236c' includes inputs A3', B3', C3', D3', 4-LUT 236d' includes inputs A4', B4', C4' and D4' and 4-LUT 236e' includes inputs A5', B5', C5' and D5'.

As re-routed, inputs A1'–A5' and B1'–B5' are driven by the same signals that drove inputs A1–A5 and B1–B2, respectively, in logic circuit 200 shown in FIGS. 4 and 5. Specifically, inputs A1'–A5' are driven by input signals SigA1–SigA5 and inputs B1'–B5' are driven by signals SigB1–SigB5. Inputs C1'–C5' are now driven by signal SigC that previously drove the gating control input of non-arithmetic logic section 250. And, inputs D1' through D5' are driven by signals d1–d5, respectively.

Along with re-routing the inputs to non-arithmetic logic portion 250 as described above, 4-LUTs 236a', 236b', 236c', 236d', and 236e', are reconfigured such that when the gating control signal SigC is asserted, output signals Out1, Out2, Out3, Out4 and Out5 of arithmetic logic operators 212', 214', 216', 218' and 220', respectively, are equal to Sum1, Sum2, Sum3, Sum4 and Sum5, and when the gating control signal SigC is de-asserted, output signals Out1, Out2, Out3, Out4 and Out5 are given by the function carried out by the non-arithmetic logic block with the output of LEs 212, 214, 216, 218 and 220 forced to zero. The function performed by each LE 212, 214, 216, 218 and 220, shown in FIG. 4, is given by, respectively:

Sum1=A1 XOR B1;

Sum2=A2 XOR B2;

Sum3=A3 XOR B3;

Sum4=A4 XOR B4; and

Sum5=A5 XOR B5.

And the output signals of 2-MUXs 252,254,256, 258 and 260 of non-arithmetic logic section 250 are given by, respectively:

Out1=(Sum1 & SigC)# (d1 & !SigC);

Out2=(Sum2 & SigC)# (d2 & !SigC);

Out3=(Sum3 & SigC)# (d3 & !SigC);

Out4=(Sum4 & SigC)# (d4 & !SigC); and

Out5=(Sum5 & SigC)# (d5 & !SigC).

Thus, referring again to FIG. 6, it can be shown that the new functions F1', F2', F3', F4' and F5' with which 4-LUTs 236a', 236b', 236c', 236d', and 236e', respectively, are configured are given by, respectively:

F1'=[C1 & (A1 XOR B1)]# [!C1 & (D1 & !C1)];

F2'=[C2 & (A2 XOR B2)]# [!C2 & (D2 & !C2)];

F3'=[C3 & (A3 XOR B3)]# [!C3 & (D3 & !C3)];

F4'=[C4 & (A4 XOR B4)]# [!C4 & (D4 & !C4)]; and

F5'=[C5 & (A5 XOR B5)]# [!C5 & (D5 & !C5)].

After this reconfiguration 2-MUXs 252, 254, 256, 258 and 260 are no longer necessary to generate signals Out1–Out5 and may advantageously be used in a different logic function.

Although particular embodiments have been described in detail, various modifications to the embodiments described herein may be made without departing from the spirit and scope of the present invention, thus, the invention is limited only by the appended claims.

What is claimed as new and desired to be protected by Letters Patent of the United States is:

1. A method of incorporating non-arithmetic logic into arithmetic logic feeding the non-arithmetic logic including:

identifying a programmable logic element performing an arithmetic logic function Fn the programmable logic element having a plurality of LE inputs and at least a first logical AND gate, the inputs of the first logical AND gate connected to at least two of the plurality of LE inputs, the programmable logic element further driven by at least one LE signal and driving an output signal Sn, the output signal Sn driving a fan-out free non-arithmetic logic block, the non-arithmetic logic block driven by a plurality of block signals including at least a block signal c and at least one further block signal such that;

when c is asserted a function Gn of the non-arithmetic logic block generates output signal Sn;

when c is not asserted, the Gn is not a function of Sn; and the number of LE signals driving the programmable logic operator plus the number of block signals driving the non-arithmetic logic block minus 1 is less than or equal to the number of LE inputs;

rerouting the at least one further block signal and the block signal c to drive the programmable logic element, and reprogramming the function Fn of the programmable logic element to carry out the function Fn' such that when c is asserted Fn' is equal to Fn and when c is not asserted Fn' is equal to Gn with Sn de-asserted.

2. The method of claim 1 wherein the plurality of LE inputs includes n LE inputs and the function Fn is of the form:

$$Fn=F(In1, In2 \ldots Inn)+(Ini \& Inj)$$

where "In1, In2 . . . Inn" are the plurality of n LE inputs, "Ini" and "Inj" are two of the plurality of n LE inputs, and "&" indicates a logical AND function.

3. The method of claim 2 wherein:

the programmable logic element includes a look up table ("LUT"); and reprogramming the function Fn includes reprogramming the LUT.

4. The method of claim 3 wherein the plurality of LE inputs to the programmable logic element include inputs to the LUT.

5. The method of claim 4 wherein the non-arithmetic logic block includes one or more logic gates for carrying out one or more boolean logic functions.

6. The method of claim 5 wherein rerouting the at least one further block signal includes rerouting the at least one further block signal and the block signal c to drive previously unused inputs of the programmable logic element.

7. The method of claim 1 wherein the arithmetic programmable operator includes a carry-in input driven by a carry-in signal and including driving a second logical AND gate with the carry-in signal and the block signal c; and driving the carry-in input to the arithmetic programmable operator with an output from the second logical AND gate.

8. A computer readable storage medium containing computer executable code for incorporating non-arithmetic logic into arithmetic logic feeding the non-arithmetic logic by instructing a computer to operate as follows:

identify a programmable logic element performing an arithmetic logic function Fn the programmable logic element having a plurality of LE inputs and at least a first logical AND gate, the inputs of the first logical AND gate connected to at least two of the plurality of LE inputs, the programmable logic element further driven by at least one LE signal and driving an output signal Sn, the output signal Sn driving a fan-out free non-arithmetic logic block, the non-arithmetic logic block driven by a plurality of block signals including at least a block signal c and at least one further block signal such that;

when c is asserted a function Gn of the non-arithmetic logic block generates output signal Sn;

when c is not asserted, Gn is not a function of Sn; and the number of LE signals driving the programmable logic operator plus the number of block signals driving the non-arithmetic logic block minus 1 is less than or equal to the number of LE inputs;

reroute the at least one further block signal and the block signal c to drive the programmable logic element, and reprogram the function Fn of the programmable logic element to carry out the function Fn' such that when c is asserted Fn' is equal to Fn and when c is not asserted Fn' is equal to Gn with Sn de-asserted.

9. The computer readable medium of claim 8 wherein:

the plurality of LE inputs includes n LE inputs and the function Fn is of the form:

$$Fn=F(In1, In2 \ldots Inn)+(Ini \& Inj)$$

where "In1, In2 . . . Inn" are the plurality of n LE inputs, "Ini" and "Inj" are two of the plurality of n LE inputs, and "&" indicates a logical AND function.

10. The computer readable medium of claim 9 wherein:

the programmable logic element includes a look up table ("LUT"); and the computer is further instructed to reprogram the LUT.

11. The computer readable medium of claim 10 wherein the plurality of LE inputs include inputs to the LUT.

12. The computer readable medium of claim 11 wherein the non-arithmetic logic block includes one or more logic gates for carrying out one or more boolean logic functions.

13. The computer readable medium of claim 12 wherein the computer is further instructed to reroute the at least one further block signal and the block signal c to drive previously unused inputs of the programmable logic element.

14. The computer readable medium of claim 8 wherein:

logic element includes a carry-in input driven by a carry-in signal; and the computer is further instructed to;

drive a second logical AND gate with the carry-in signal and the block signal c; and drive the carry-in input to the programmable logic element with the output from the second logical AND gate.

* * * * *